(12) United States Patent
Lawange

(10) Patent No.: US 10,056,890 B2
(45) Date of Patent: Aug. 21, 2018

(54) DIGITAL CONTROLLED OSCILLATOR BASED CLOCK GENERATOR FOR MULTI-CHANNEL DESIGN

(71) Applicant: Exar Corporation, Fremont, CA (US)

(72) Inventor: Omeshwar Lawange, Fremont, CA (US)

(73) Assignee: Exar Corporation, Fremont, CA (US)

( * ) Notice: Subject to any disclaimer, the term of this patent is extended or adjusted under 35 U.S.C. 154(b) by 4 days.

(21) Appl. No.: 15/192,970

(22) Filed: Jun. 24, 2016

(65) Prior Publication Data
US 2017/0373674 A1 Dec. 28, 2017

(51) Int. Cl.
| | |
|---|---|
| H03K 21/00 | (2006.01) |
| H03K 5/14 | (2014.01) |
| H03K 21/10 | (2006.01) |
| H03K 3/037 | (2006.01) |
| H03K 23/66 | (2006.01) |
| H03K 23/68 | (2006.01) |
| H03K 5/00 | (2006.01) |

(52) U.S. Cl.
CPC ............ *H03K 5/14* (2013.01); *H03K 3/037* (2013.01); *H03K 21/10* (2013.01); *H03K 23/66* (2013.01); *H03K 23/68* (2013.01); *H03K 2005/00058* (2013.01)

(58) Field of Classification Search
CPC .......... H03K 5/14; H03K 3/037; H03K 21/10; H03K 2005/00058
USPC ........................................................ 377/48
See application file for complete search history.

(56) References Cited

U.S. PATENT DOCUMENTS

| | | | | | |
|---|---|---|---|---|---|
| 4,231,104 | A | * | 10/1980 | St. Clair | ......... G01R 31/31922 377/48 |
| 4,809,221 | A | * | 2/1989 | Magliocco | ....... G01R 31/31922 377/39 |

(Continued)

FOREIGN PATENT DOCUMENTS

WO    WO 2012/030483 A2    3/2012

OTHER PUBLICATIONS

PCT International Search Report and Written Opinion of the International Searching Authority for application PCT/US2011/046962 dated Dec. 16, 2011.
PCT International Preliminary Report on Patentability for application PCT/US2011/046962 dated Feb. 11, 2014.

*Primary Examiner* — Ryan Jager
(74) *Attorney, Agent, or Firm* — McAndrews, Held & Malloy

(57) ABSTRACT

A clock divider includes, in part, a pair of counters and a programmable delay line. A first one of the counters operates at a first frequency and is configured to count using a first integer portion of the divisor. The second counter operates at a second frequency smaller than the first frequency and is configured to count using a second integer portion of the divisor. The programmable delay line includes, in part, a chain of delay elements configured to generate a multitude of delays of the output of the second counter. A multiplexer selects one of the generated delays in accordance with the fractional portion of the divisor. The second counter increases its count only when the first counter reaches a terminal count. The first and second integer portions are loaded respectively into the first and second counters when the second counter reaches its terminal count.

20 Claims, 6 Drawing Sheets

(56) References Cited

U.S. PATENT DOCUMENTS

| | | | | |
|---|---|---|---|---|
| 4,965,531 A * | 10/1990 | Riley | ................... | H03B 19/00 |
| | | | | 327/107 |
| 5,119,406 A | 6/1992 | Kramer | | |
| 5,471,511 A | 11/1995 | De Langhe et al. | | |
| 5,790,614 A | 8/1998 | Powell | | |
| 6,501,307 B1 | 12/2002 | Yen | | |
| 6,501,809 B1 | 12/2002 | Monk et al. | | |
| 7,164,297 B2 * | 1/2007 | Flynn | ................... | H03K 23/68 |
| | | | | 327/105 |
| 7,180,974 B2 * | 2/2007 | De Gouy | ................ | G06F 7/68 |
| | | | | 327/117 |
| 7,702,946 B2 * | 4/2010 | Wolf | ..................... | H04J 3/076 |
| | | | | 370/504 |
| 7,844,650 B2 | 11/2010 | Warner et al. | | |
| 7,986,190 B1 * | 7/2011 | Lye | ..................... | H03L 7/1976 |
| | | | | 331/1 A |
| 8,090,066 B2 | 1/2012 | Ji et al. | | |
| 8,406,361 B2 | 3/2013 | Den Besten et al. | | |
| 8,558,575 B1 * | 10/2013 | Abernethy | ............. | H03K 21/10 |
| | | | | 326/52 |
| 8,867,682 B2 * | 10/2014 | Lawange | ................ | H04J 3/076 |
| | | | | 375/371 |
| 2004/0201939 A1 * | 10/2004 | Shipton | ............... | B41J 2/04505 |
| | | | | 361/104 |
| 2007/0041324 A1 * | 2/2007 | Shenoi | ..................... | G06F 5/14 |
| | | | | 370/235 |
| 2010/0039157 A1 * | 2/2010 | Kaeriyama | ............. | G06F 1/08 |
| | | | | 327/292 |

\* cited by examiner

DIGITAL CONTROLLED OSCILLATOR BASED CLOCK GENERATOR FOR MULTI-CHANNEL DESIGN

CROSS-REFERENCES TO RELATED APPLICATIONS

The present application is related to U.S. Pat. No. 8,867,682, the content of which is incorporated herein by reference in its entirety.

BACKGROUND OF THE INVENTION

In telecom circuits low speed signal paths are commonly mapped into higher speed signal paths to enable the routing of high bandwidth traffic from one node to another node using SONET/SDH framed data. Add/drop multiplexers are often used on the network interface cards to support such mapping and demapping operations. However, demapper circuits typically generate gapped and jittery clocks which conventional circuits are not well adapted to handle. A need continues to exist for an improved technique of dividing a clock signal.

BRIEF SUMMARY OF THE INVENTION

A clock divider circuit configured to divide a clock frequency by a number having an integer portion and a fractional portion, in accordance with one embodiment of the present invention includes, in part, a pair of counters and a programmable delay line. The first counter operates at a first frequency and is configured to count using a first portion of the integer. The second counter operates at a second frequency smaller than the first frequency and is configured to count using a second portion of the integer. The programmable delay line includes, in part, a chain of delay elements configured to delay an output of the second counter by the fractional portion.

In one embodiment, the first counter is a down counter. In one embodiment, the second counter is an up counter. In one embodiment, the first counter is a roll counter. In one embodiment, the second counter may increase its count only when the first counter reaches a terminal count.

In one embodiment, the clock divider further includes, in part a flip-flop that stores an inverse of its output value when the second counter reaches its terminal count. In one embodiment, the first integer and second portions are loaded respectively into the first and second counters when the second counter reaches its terminal count. In one embodiment, the clock is a clock of a phase-locked loop circuit. In one embodiment, the programmable delay line further includes, in part, a multiplexer configured to select a delay from a multitude of delays generated across the chain of delay elements. In one embodiment, the first counter is an 8-bit down counter and the second counter is a 24-bit up counter.

A method of dividing a clock signal by a number having an integer portion and a fractional portion, includes, in part, counting using a first portion of the integer at a first frequency, counting using a second portion of the integer at a second frequency smaller than the first frequency, and delaying the output of the second counter by the fractional portion using a chain of delay elements.

In one embodiment, the first portion is counted using a down counter. In one embodiment, the second portion is counted using an up counter. In one embodiment, the down counter is a roll counter. In one embodiment, the up counter is enabled to increase its count only when the down counter reaches a terminal count.

In one embodiment, the method further includes, in part, inverting a stored value when the second counter reaches its terminal counts. In one embodiment, the method further includes, in part, loading the first integer portion into the first counter and the second integer portion into the second counter when the second counter reaches its terminal counts. In one embodiment, the clock is a clock of a phase-locked loop circuit. In one embodiment, the method further includes, in part, selecting a delay from a multitude of delays present across the chain of delay elements in accordance with the fractional portion. In one embodiment, the first counter is an 8-bit down counter and the second counter is a 24-bit up counter.

DETAILED DESCRIPTION OF THE INVENTION

In accordance with one embodiment of the present invention, a digital-controlled oscillator (DCO) includes circuitry adapted to attenuate jitter up to 1/N of a reference clock, where N is an integer number. Embodiments of the present invention, as described below, may therefore divide a reference or master clock frequency by any integer or non-integer number to generate a second clock signal having a lower frequency defined by such division. Accordingly, when N instances of a clock divider, in accordance with embodiments of the present are used, the same master or reference clock signal may be used to generate N distinct clock signals each having a frequency defined by one of N divisions, where N is an integer number, For example, embodiments of the present invention may be used in forming time stamp clocking circuit in accordance with the IEEE 1588 standard.

Figure 1:
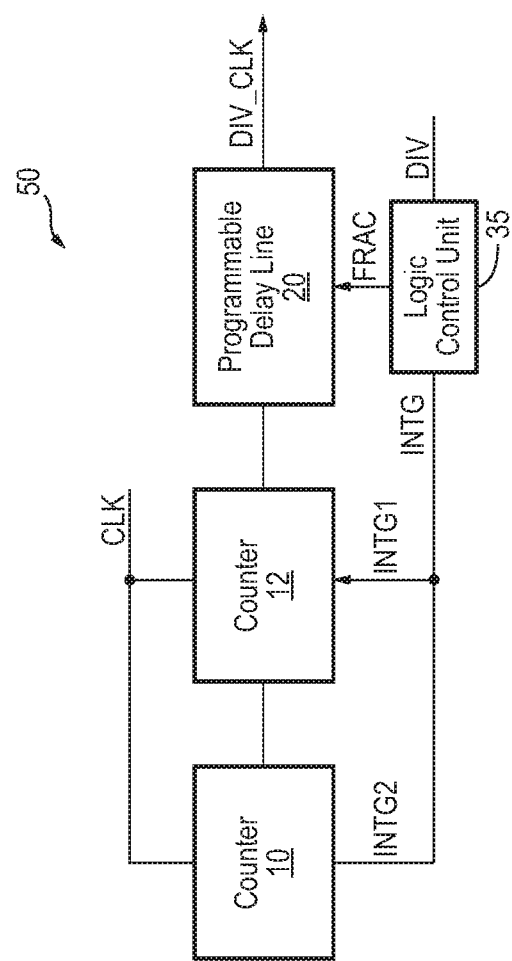
FIG. 1 is a simplified high-level block diagram of a clock divider circuit, in accordance with one embodiment of the present invention.

FIG. 1 is a simplified high-level block diagram of a clock divider 50 configured to divide clock signal CLK by any integer or non-integer number DIV, in accordance with one embodiment of the present invention. Clock divider 50 is shown as including, in part, counters 10, 12, programmable delay line 20 and logic control unit 35. Logic control unit 35 is configured to receive divisor DIV and determine the integer portion INTG and the fractional portion FRAC of the division. Logic control unit 35 delivers a first portion INTG1 of the integer portion to counter 10, a second portion INTG2 of the integer portion to counter 12, and the fractional portion FRAC of the division to programmable delay line 20. Counters 10 and 12 are configured to respectively divide clock signal CLK by the integer portions INTG1 and INTG2 of divisor DIV. Programmable delay line 20 is configured to divide the output of counter 12 by the fractional portion FRAC of divisor DIV. The output of programmable delay line 20 is clock signal DIV_Clk that has a frequency equal to 1/DIV of the frequency of the clock signal CLK. Counters 10 and 12 may be up-counters, down counters, and the like.

Counter 10 is configured to operate at the frequency of clock signal Clk. Counter 12 is, however, configured to operate at a fraction of the frequency of the clock signal CLK, thereby lowering the power consumption of clock divider 50. Since counter 12 has more bits of the divider and operates at a significantly lower frequency (i.e., equal to the frequency of CLK divided by $2^{no.\ of\ bits\ in\ counter\ 10}$) clock divider 50 may be formed using a smaller technology node such as 90 nm or 130 nm. Programmable delay line has a multitude of delay (alternatively referred to herein as buffer) elements forming a delay chain. In one embodiment, each delay element delay (alternatively referred to herein as delay stage) generates the same delay. The output of each delay stage is supplied to a multiplexer disposed in programmable delay line. The multiplexer selects the required delay as represented by the fractional portion FRAC of the divisor.

Figure 2:
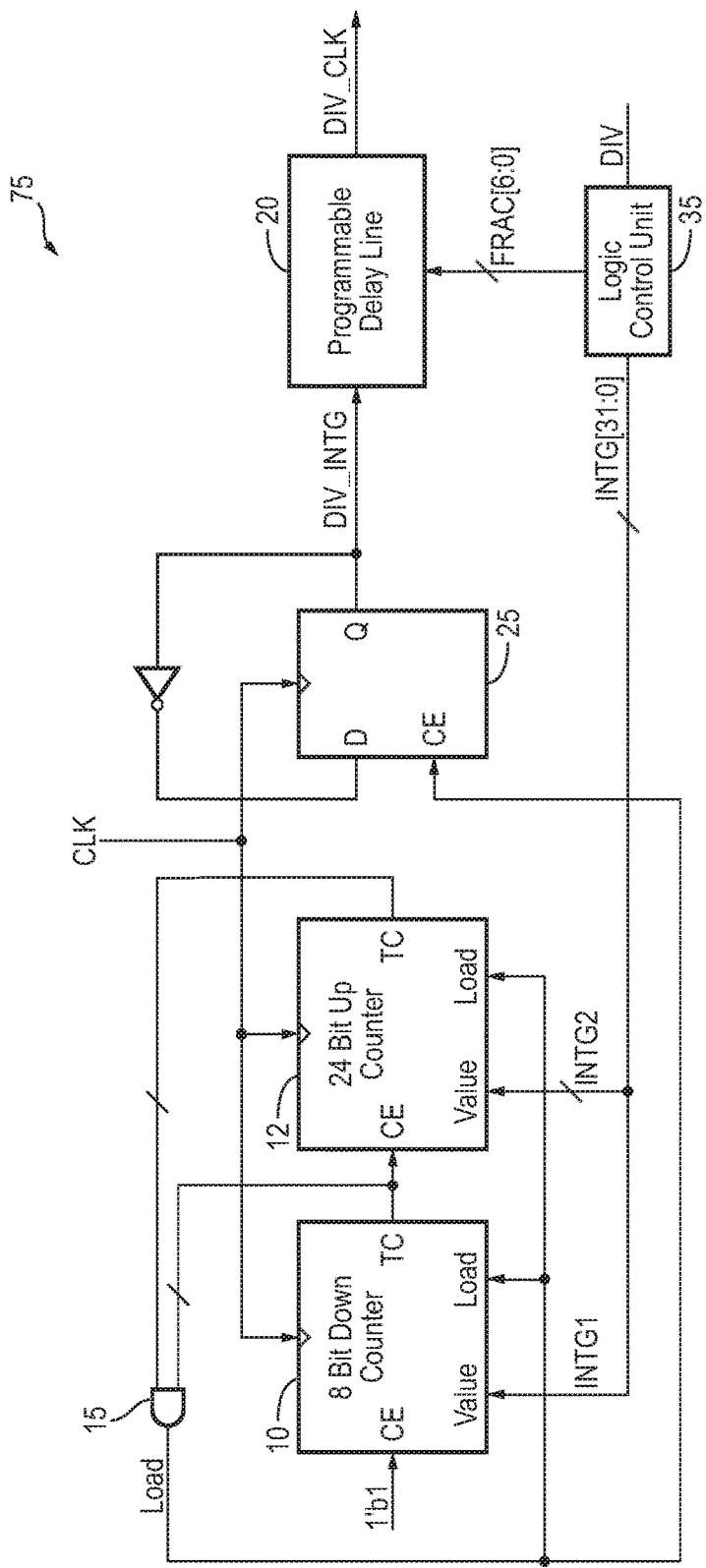
FIG. 2 is a simplified high-level block diagram of a clock divider circuit, in accordance with one embodiment of the present invention.

FIG. 2 is a simplified high-level block diagram of a clock divider 75 configured to divide clock signal CLK by any integer or non-integer number DIV, in accordance with one exemplary embodiment of the present invention. As described above, logic control unit 35 is configured to receive divisor DIV and determine the integer portion INTG and the fractional portion FRAC of the division. Logic control unit 35 delivers a first portion INTG1 of the integer portion to counter 10, a second portion INTG2 of the integer portion to counter 12, and the fractional portion FRAC of the division to programmable delay line 20. The integer part INTG of divisor DIV is assumed to be represented by 32 bits and the fractional part FRAC of divisor DIV is assumed to be represented by 7 bits. It is understood, however, that the integer and fractional parts of DIV may be represented by any other groupings or combinations of the bits of the divisor.

In the example shown in FIG. 2, the 8 least significant bits of INTG—represented by INTG1—are loaded into counter 10 configured to operate at the frequency of clock signal CLK. The remaining 24 bits of INTG—represent by INTG2—are loaded into counter 12 configured to operate at a fraction of the frequency of clock signal CLK frequency (i.e., the frequency of CLK divided by $2^8$). It is understood, however, that INTG1 and INTG2 may be represented by other groupings/combinations of the bits of INTG. Furthermore, although in the example shown in FIG. 2, and described further below, counter 12 is assumed to run at $\frac{1}{2^8}$ of the frequency of signal CLK, it is understood that counter 12 may run at other fractional frequencies of signal CLK. Because counter 12 runs at a fraction of the frequency of signal CLK, clock divider 75 consumes relatively smaller power.

In the exemplary embodiment shown in FIG. 2, counters 10 and 12 are assumed to be down counters and up counters respectively. It is understood, however, that counters 10 and 12 may be any other types of counter, such as roll counters and the like. Values INTG1 and INTG2 are loaded into counters 10 and 12 when signal load is asserted.

Counter 10 is adapted to divide the frequency of signal CLK by the 8-bit value INTG1 loaded into counter 10, i.e., when signal CE of counter 10 is asserted. To achieve this, counter 10 starts to count down from INTG1 with each transition of signal CLK. When the count of counter 10 reaches a terminal count having a binary value of zero, output signal TC of counter 10 is asserted. In other words, once enabled, signal TC of counter 10 transitions every time counter 10's count reaches a terminal count of zero.

While signal TC of counter 10 remains asserted, counter 12 is enabled and thus increments its count with each rising transition of signal CLK. When the count of counter 12 reaches INTG2, the output signal TC of counter 12 is also asserted. In other words, once enabled, signal TC of counter 12 transitions after INTG2 count of signal CLK. Therefore, once counter 10 is enabled, after INTG count of signal CLK (INTG {INTG1, INTG2}), a transition is generated at the output signal TC of counter 12. Consequently, signal TC of counter 12 represents a division of signal CLK by signal INTG. When signals TC of counter 12 is asserted and counter 10 reaches the value 1, output signal Load of AND gate 15 is asserted thereby causing values INTG1 and INTG2 to be loaded into counters 10 and 12 to restart the count operations.

As shown, signal Load is also applied to the enable terminal CE of flip-flop 25. Accordingly, with each assertion of signal TC of counter 12, the output signal of flip-flop 20 toggles either from 1 to 0, or from 0 to 1 to generate a transition on signal DIV_INTG. The output signal DIV_INTG of flip-flop 25 is applied to programmable delay line 20, described further below.

Figure 3:
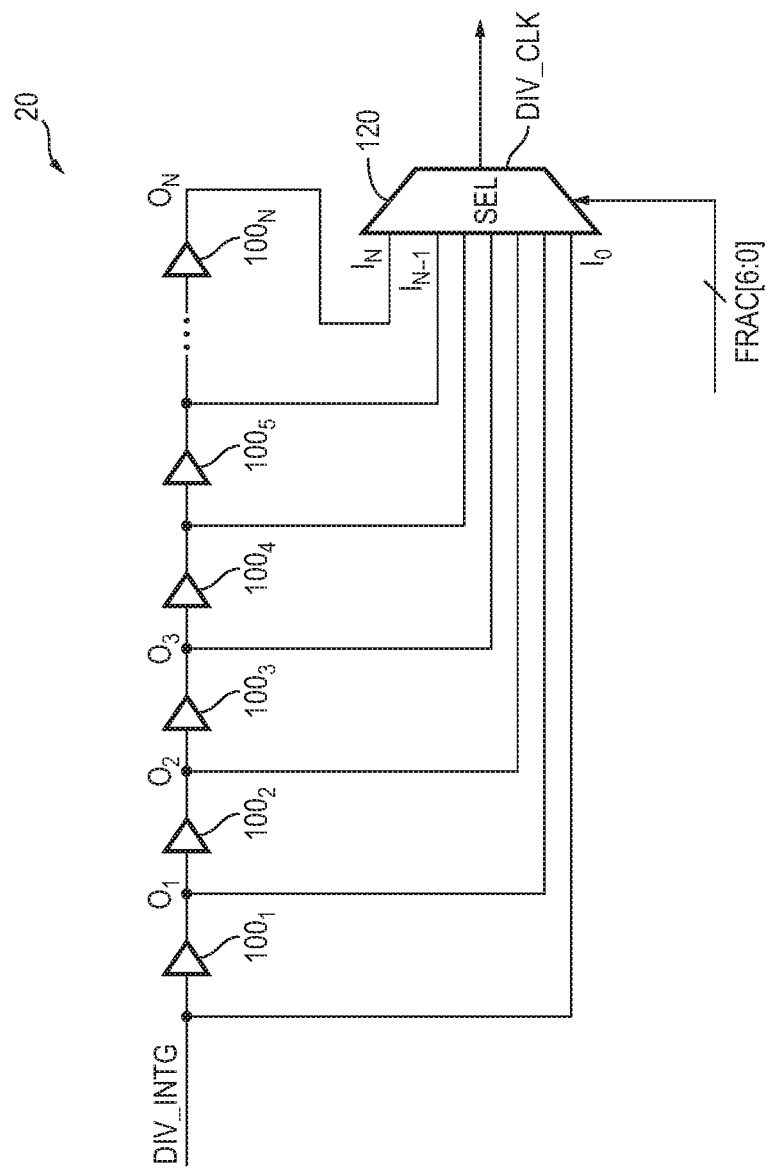
FIG. 3 is a block diagram of a programmable delay line disposed in the clock divider circuits of FIGS. 1 and 2, in accordance with one embodiment of the present invention.

FIG. 3 is a simplified block diagram of programmable delay line 20, in accordance with one embodiment of the present invention. Programmable delay line 20 is shown as including one hundred delay elements $100_1, 100_2 \ldots 100_N$ forming a delay chain in this exemplary embodiment. It is understood however that a programmable delay line, in accordance with embodiments of the present invention may have any number N of delay elements, where N is an integer greater than one. The delay across each delay element $100_i$, where i is an integer ranging from 1 to N, is assumed to be 10 picosecond (ps) in this exemplary embodiment. It is understood however that in other embodiments, different delay elements may have different values. In the embodiment shown in FIG. 3, multiplexer 120 has 101 input terminals one of which is selected in accordance with the select signal FRAC[6:0].

Programmable delay elements $100_1\text{-}100_N$ receive signal DIV_INTG and generate N delay replicas of this signal. The output signal of each delay element is applied to one of the input terminals of multiplexer 120. The select terminal SEL of multiplexer 120 receives the fractional part of the divisor, namely FRAC[6:0]. In response to signal FRAC[6:0], multiplexer 120 selects and supplies the output signal of one of the delay elements 100. Clock signal DIV_CLK supplied at the output of multiplexer 120 has a frequency defined by 1/DIV[38:0] of the frequency of clock signal CLK.

Assume, for example, that it is desired to generate a 49.408 MHz clock signal at DIV_CLK from clock signal CLK having a frequency of 2 GHz. To achieve this, the 2 GHz clock is divided by $$\frac{2 \times 10^9}{49.408 \times 10^6} = 40.48$$

where the fractional portion is rounded up to two decimal points. Accordingly, the integer portion INTG[31:0] has a decimal value of 20, thereby causing signal TC of counter 12 and thus signal Load to toggle after every 20 clock cycles of the 2 GHz clock CLK. In other words, signal DIV_INTG is a clock signal whose frequency is 1/40 of the frequency of clock signal CLK.

The fractional portion FRAC[6:0] has a decimal value of 48, half of which is 24. Accordingly, multiplexer 120 of FIG. 3 selects the output of delay element 100$_{24}$ so that signal DIV_CLK has a 240 ps delay with respect to signal DIV_INTG. Accordingly, clock signal DIV_CLK has a frequency of 49.408 MHz.

For another example, assume that it is desired to generate a 100.24 Hz clock at DIV_CLK from a 2 GHz clock signal CLK. The integer portion of the division $$\frac{2\times 10^9}{100.24}$$

is 19,952,114, half of which is 9,976,057. Therefore, the 32-bit signal INTG[31:0] causes a toggle for each of signals LOAD and DIV_INTG (see FIG. 2) after every 9,976,057 cycles of the 2 GHz clock signal CLK.

The output clock DIV_CLK 100.24 Hz has a period of 9,976,057.462 ns. Therefore, for half of this period (4,988, 028.74 ns) DIV_CLK will be high and for the remaining half of this period (4,988,028.74 ns) DIV_CLK will be low. Therefore, the integer portion INTG of the divider is equal to 9,976,057 decimal (9838F9 hex) which contributes to 4,988,028.50 ns at 2 GHz frequency of CLK (although only lower 8 bits of divider run at 2 GHz and upper 24 bits run at 2 GHz/256 rate). To determine the fractional portion FRAC of the divider, the integer portion 4,988,028.50 ns is subtracted from ½ period, namely 4,988,028.74 ns, of DIV_CLK. This subtraction yields a value of 0.24 ns for the fractional portion of the division. There, the fraction portion FRAC has a decimal value of 24 decimal (18 hex). Accordingly, multiplexer 120 of FIG. 3 selects the output of delay element 100$_{24}$ so that signal DIV_CLK has a 240 ps delay with respect to signal DIV_INTG. Accordingly, clock signal DIV_CLK has a frequency of 100.24 Hz in this example.

For yet another example, assume that is desired to divide clock CLK by a decimal value of 515, which is represented by 203 in hex. Accordingly, logic control unit causes an 8-bit binary value of [00000011] to be loaded into down counter 10, and a 24-bit binary value of [000000000000000000000010] to be loaded into up counter 12. Since the divisor is an integer number, FRAC[6:0] has a value of 0, thereby causing signal DIV_INTG received at input terminal $I_0$ of multiplexer 120 to be selected and delivered as output signal DIV_CLK. 8

Figure 4A:
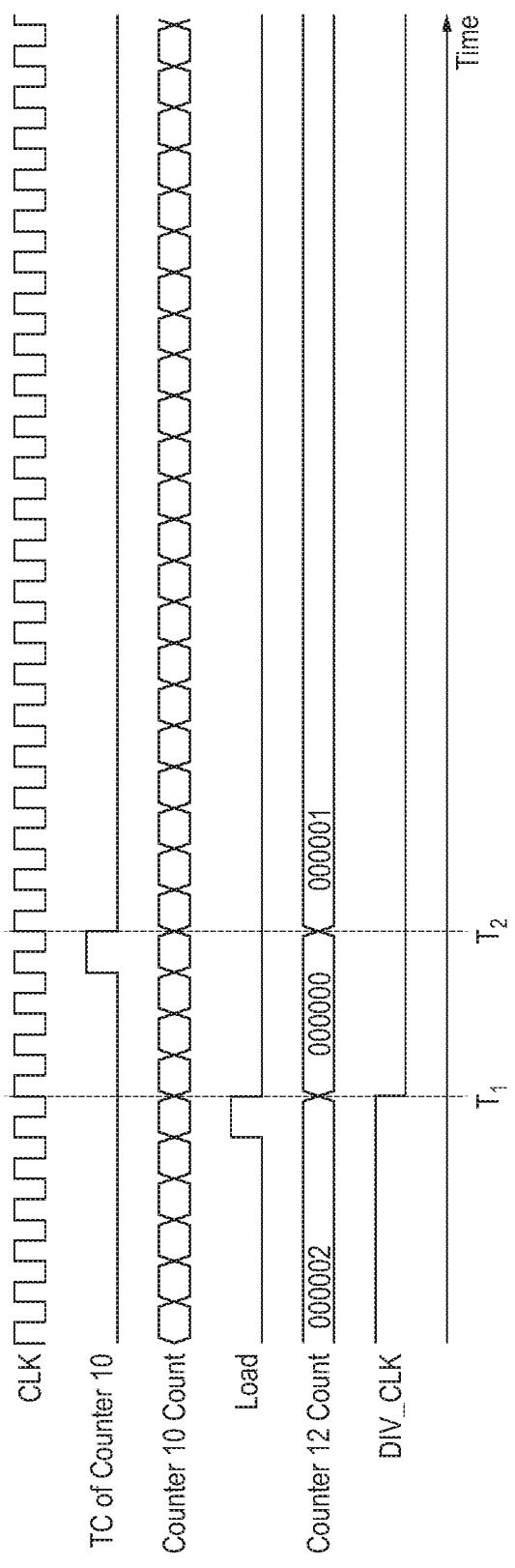
FIGS. 4A and 4B are waveforms of a number of signals associated with the clock divider of FIG. 2 when programmed to divide a 2 GHz clock signal by a decimal value of 515, in accordance with one embodiment of the present invention.
Figure 4B:
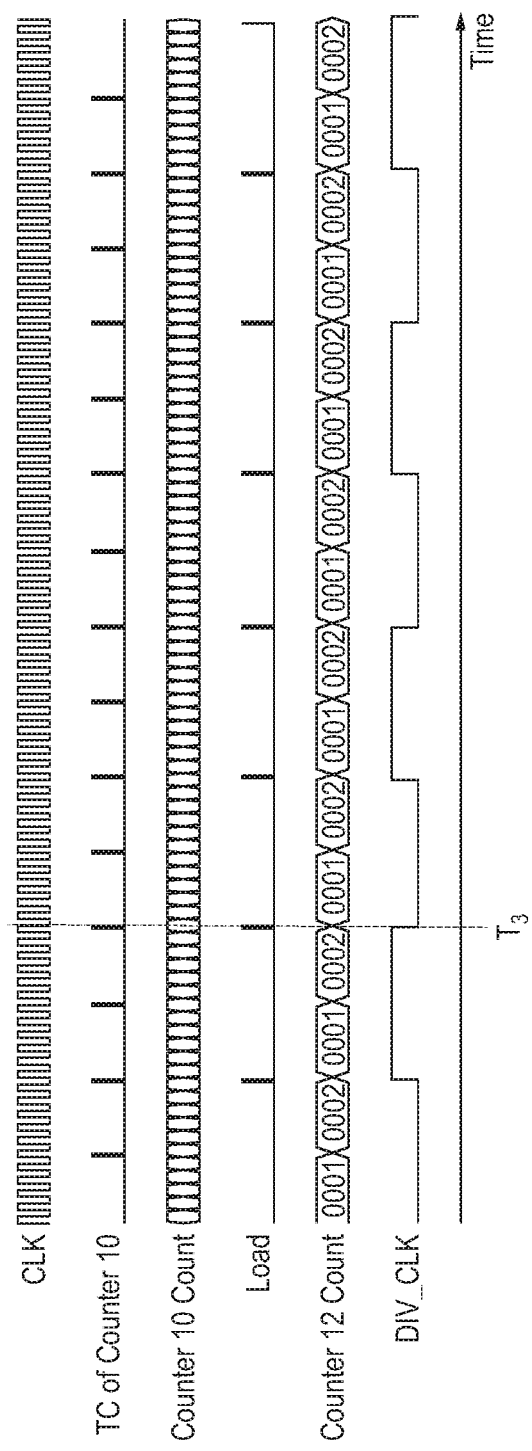

FIGS. 4A and 4B are waveforms of a number of signals associated with clock divider 75. Referring to FIG. 4A, it is seen that when signal Load is asserted at time $T_1$, counter 10 is loaded with value of 3 and counter 12 is reset to an initial value of 2. Thereafter, with each rising edge of clock signal CLK, counter 10's count decreases by 1 until it reaches a count of 0 at which point signal TC of the counter is asserted. While signal TC remains asserted, each rising edge of signal CLK causes the count of counter 12 to increase by one. For example, at time $T_2$, while signal TC of counter 10 remains high, the rising edge of signal CLK causes the count of counter 12 to increase from 0 to 1.

Referring to FIGS. 4A and 4B concurrently, because counter 10 is an 8-bit counter, it reaches a count of 0 once every 256 cycles of clock CLK. Accordingly, counter 10's output signal TC and thus counter 12's count is also incremented once every 256 cycles of signal CLK. Once counter 12's count reaches a terminal count of 2 and counter 10's count reaches a value of 1 at time $T_3$, a transition occurs on clock signal DIV_CLK, thereby causing signal Load to be asserted to start another cycle of down-counting at counter 10 and up-counting at counter 12. Accordingly, there are 515 cycles of signal CLK in each period of clock DIV_CLK. It is understood that since 515 is an integer, the programmable delay line 20 does not cause any further delays in generating the edges of signal DIV_CLK.

For yet another example, assume that it is desired to generate from CLK a clock signal having a frequency of 1.544 MHz. To achieve this, signal CLK is divided by 1295.34 (rounded up to the nearest two decimal points). Accordingly, DIV_CLK must toggle after every 647.67 (half of 1295.34) cycles of the 2 GHz clock CLK. Therefore, after each 647.67 periods of signal CLK, namely after each 323.84 ns, DIV_CLK will toggle. Because clock period precision is 10 ps, the delay of 323.835 ns is approximated by 323.840 ns, which may be divided in to 323.50 ns+0.34 ns of delay. The 323.50 ns of delay may be achieved by 647 clock cycles of the 2 GHz clock, namely 647×0.5 ns=323.50 ns.

The remaining part of the period (0.67×0.5 ns=0.340 ns after rounding to nearest 10 ps) is achieved by the fractional divider. Therefore, logic control unit 35 determines an integer value INTG of 647 (32-bit hex value 32'h0000_0287) for counters 10, 12 and a fractional value FRAC of 34 (7-bit hex value of 7'h22) for the programmable delay line.

Figure 5:
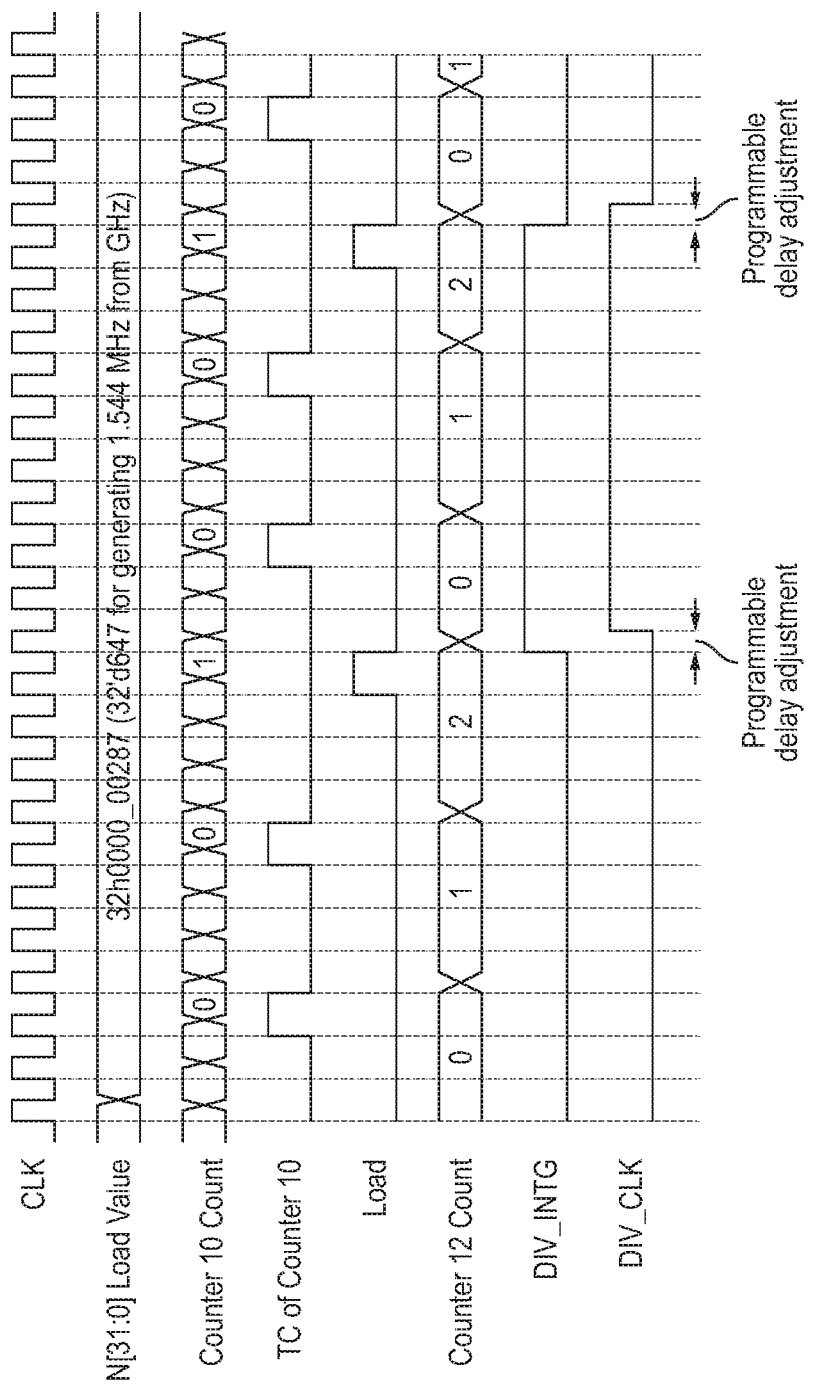
FIG. 5 is a timing diagram of number signals associated with the clock divider of FIG. 2 when programmed to generate a 1.544 MHz clock from a 2 GHz clock, in accordance with one embodiment of the present invention.

FIG. 5 is a timing diagram of various signals associated with clock divider 75 when it is programmed to generate a 1.544 MHz clock by dividing a 2 GHz clock, as described above. After loading the 32'h0000_0287 into counters 10 and 12, counter 10 starts to decrement its count from an initial loaded value of 135 decimal (87 hex) with each transition of the 2 GHz clock CLK. When counter 10's count reaches a terminal count value of 0 signal TC of counter 10 is asserted thereby enabling counter 12 to start incrementing its count. Since counter 12 operates at 1/256 frequency of counter 10, it takes 256 clock cycles of clock CLK for counter's 12 count to be incremented by 1. When counter 12 is at the count 2 and counter 10 is at a count 1 (i.e., after 647 cycles of clock CLK), signal Load is asserted thus causing signal DIV_INTG to toggle. Programmable delay element 20 causes signal DIV_INT to toggle 340 ps after each toggle of signal DIV_INTG. In other words, signal FRAC[6:0] causes the output of delay element 100$_{34}$ to be selected. Accordingly, the integer part of 32'd647 clock cycles contributes 323.50 ns and the fractional part of 7'd34 contributes 0.34 ns to the generation of clock DIV_CLK.

The above embodiments of the present invention are illustrative and not limitative. Embodiments of the present invention are not limited by the number of counters counting the integer part of the division. Embodiments of the present invention are not limited by the number of bits of the counters or the number of delay elements of the programmable delay line. Other additions, subtractions or modifications are obvious in view of the present disclosure and are intended to fall within the scope of the appended claims.

What is claimed is:

1. A clock divider configured to divide a frequency of a received clock signal by a number having an integer portion and a fractional portion, the clock divider comprising:
   a first counter configured to generate a first output signal at a first frequency, where the first frequency is based on the received clock signal and a first portion of the integer portion of the number;

a second counter configured to receive the first output signal and the received clock signal to generate a second output signal at a second frequency, where the second frequency is based on the received clock signal and a second portion of the integer portion of the number, and where the second frequency is smaller than the first frequency; and a programmable delay line comprising a chain of delay elements and adapted to delay the second output signal based on the fractional portion of the number.

2. The clock divider of claim 1 wherein the first counter is a down counter.

3. The clock divider of claim 2 wherein the second counter is an up counter.

4. The clock divider of claim 3 wherein the first counter is a roll counter.

5. The clock divider of claim 3 wherein said second counter is enabled to increase its count only when the first counter reaches a terminal count.

6. The clock divider of claim 5 further comprising a flip-flop that is enabled to store an inverse of its output value when the first counter reaches a count of 1 and the second counter reaches its terminal count.

7. The clock divider of claim 6 wherein said first portion of the integer portion of the number is loaded into the first counter and said second portion of the integer portion of the number is loaded into the second counter whenever the first counter reaches the count of 1 and the second counter reaches its terminal count.

8. The clock divider of claim 7 wherein the received clock signal is a clock of a phase-locked loop circuit.

9. The clock divider of claim 8 wherein said programmable delay line further comprises a multiplexer configured to select a delay from a plurality of delays across the chain of delay elements.

10. The clock divider of claim 9 wherein said first counter is an 8-bit down counter and wherein said second counter is a 24-bit up counter.

11. A method of dividing a frequency of a received clock signal by a number having an integer portion and a fractional portion, the method comprising:

generating, using a first counter, a first output signal at a first frequency, where the first frequency is based on the received clock signal and a first portion of the integer portion of the number;

generating, using a second counter coupled to the first counter, a second output signal at a second frequency, where the second frequency is based on the received clock signal and a second portion of the integer portion of the number, and where the second frequency is smaller than the first frequency; and delaying the second output signal based on the fractional portion via a chain of delay elements.

12. The method of claim 11 further comprising:
counting from a first portion of the integer using a down counter.

13. The method of claim 12 wherein the down counter is a roll counter.

14. The method of claim 12 further comprising:
counting from the second portion of the integer using an up counter.

15. The method of 14 wherein the up counter is enabled to increase its count only when the down counter reaches a terminal count.

16. The method of claim 15 further comprising:
inverting a stored value when the first counter reaches a count of 1 and the second counter reaches its terminal counts.

17. The method of claim 16 further comprising:
loading the first portion of the integer portion of the number into the first counter and the second portion of the integer portion of the number into the second counter when the first counter reaches a count of 1 and the second counter reaches its terminal counts.

18. The method of claim 17 wherein the received clock signal is a clock of a phase-locked loop circuit.

19. The method of claim 18 further comprising selecting a delay from a plurality of delays of the chain of delay elements in accordance with the fractional portion of the number.

20. The method of claim 19 wherein said first counter is an 8-bit down counter and wherein said second counter is a 24-bit up counter.

* * * * *